United States Patent
Guha et al.

(10) Patent No.: US 8,592,675 B2
(45) Date of Patent: Nov. 26, 2013

(54) PHOTOVOLTAIC DEVICES WITH ENHANCED EFFICIENCIES USING HIGH-ASPECT-RATIO NANOSTRUCTURES

(75) Inventors: Supratik Guha, Chappaqua, NY (US); Oki Gunawan, Fair Lawn, NJ (US)

(73) Assignee: International Business Machines Corporation, Armonk, NY (US)

( * ) Notice: Subject to any disclaimer, the term of this patent is extended or adjusted under 35 U.S.C. 154(b) by 583 days.

(21) Appl. No.: 12/039,900

(22) Filed: Feb. 29, 2008

(65) Prior Publication Data

US 2009/0217971 A1    Sep. 3, 2009

(51) Int. Cl.
*H01L 31/0236*    (2006.01)
(52) U.S. Cl.
USPC ........... 136/256; 136/259; 136/260; 136/261; 136/264; 136/265
(58) Field of Classification Search
USPC ............................. 136/243–265; 438/57–98
See application file for complete search history.

(56) References Cited

U.S. PATENT DOCUMENTS

| | | | | |
|---|---|---|---|---|
| 4,099,986 | A | | 7/1978 | Diepers |
| 5,381,753 | A | | 1/1995 | Okajima et al. |
| 5,534,056 | A | | 7/1996 | Kuehnle et al. |
| 7,847,180 | B2 | * | 12/2010 | Argo et al. ............ 136/243 |
| 2002/0172820 | A1 | * | 11/2002 | Majumdar et al. ........... 428/357 |
| 2004/0021062 | A1 | | 2/2004 | Zaidi |
| 2005/0009224 | A1 | | 1/2005 | Yang et al. |
| 2005/0214967 | A1 | | 9/2005 | Scher et al. |
| 2006/0207647 | A1 | | 9/2006 | Tsakalakos et al. |
| 2006/0260673 | A1 | | 11/2006 | Takeyama |
| 2007/0012354 | A1 | | 1/2007 | Kobayashi et al. |
| 2007/0092648 | A1 | * | 4/2007 | Duren et al. ............. 427/255.31 |
| 2008/0006319 | A1 | | 1/2008 | Bettge et al. |
| 2008/0169017 | A1 | * | 7/2008 | Korevaar et al. .............. 136/249 |
| 2008/0251122 | A1 | * | 10/2008 | Ready ........................... 136/256 |
| 2011/0165724 | A1 | | 7/2011 | Guha et al. |

FOREIGN PATENT DOCUMENTS

| | | |
|---|---|---|
| EP | 1892769 | 2/2008 |
| JP | 2007324324 | 12/2007 |
| WO | WO2006138671 A2 | 12/2006 |
| WO | WO2008005327 | 1/2008 |

OTHER PUBLICATIONS

English machine translation of Yoshizumi et al. (JP 2007-324324) published Dec. 13, 2007.*

(Continued)

*Primary Examiner* — Jonathan Johnson
*Assistant Examiner* — Christina Chern
(74) *Attorney, Agent, or Firm* — Vazken Alexanian; Michael J. Chang, LLC (57) ABSTRACT

Photovoltaic devices and techniques for enhancing efficiency thereof are provided. In one aspect, a photovoltaic device is provided. The photovoltaic device comprises a photocell having a first photoactive layer and a second photoactive layer adjacent to the first photoactive layer so as to form a heterojunction between the first photoactive layer and the second photoactive layer; and a plurality of high-aspect-ratio nanostructures on one or more surfaces of the second photoactive layer. The plurality of high-aspect-ratio nanostructures are configured to act as a scattering media for incident light. The plurality of high-aspect-ratio nanostructures can also be configured to create an optical resonance effect in the incident light.

20 Claims, 6 Drawing Sheets

(56) References Cited

OTHER PUBLICATIONS

Kayes et al., Comparison of the Device Physics Principles of Planar and Radial p-n. Junction Nanorod Solar Cells. 97 J. Appl. Phys. 114302 (2005).

Guha et al. "Selective area metalorganic molecular-beam epitaxy of GaN and the growth of luminescent microcolumns on Si/SiO2," Appl. Phys. Lett. 75. 463 (1999).

English abstract of JP2006295212A, filed by Satoshi, Mitsubishi Electric Corp., Published Oct. 26, 2006.

English abstract of JPH07273486A, filed by Manfuretsudo, Kuehnle Manfred, published Oct. 20, 1995.

English abstract of JP2004214300A, filed by Yamada, Nat Inst of Adv Ind & Technol, published Jul. 29, 2004.

English abstract of JP2007258263A, filed by Terao, Pioneer Electronic Corp., published Oct. 4, 2007.

English abstract of JP2006261666A, filed by Tsakalakos, Gen Electric, published Sep. 28, 2006.

English abstract of JPS5331987A, filed by Hainritsuhi; Siemens, published Mar. 25, 1978.

English abstract of JPH05306200A, filed by Okajima, Matsushita Electric Ind Co., published Nov. 19, 1993.

Loucas Tsakalakos et. al., "Strong broadband optical absorption in silicon nanowire films", Journal of Nanophotonics, vol. 1, No. 013552, pp. 1-10, Jul. 17, 2007.

\* cited by examiner

PHOTOVOLTAIC DEVICES WITH ENHANCED EFFICIENCIES USING HIGH-ASPECT-RATIO NANOSTRUCTURES

CROSS-REFERENCE TO RELATED APPLICATIONS

This application is related to the commonly owned U.S. application Ser. No. 12/039,953, entitled "Techniques for Enhancing Efficiency of Photovoltaic Devices Using High-Aspect-Ratio Nanostructures," filed herewith on the same day of Feb. 29, 2008, the contents of which is incorporated by reference herein.

FIELD OF THE INVENTION

The present invention relates to use of nanotechnology in photovoltaics, and more particularly, to the use of nanostructures to enhance photovoltaic device light absorption and efficiency.

BACKGROUND OF THE INVENTION

Photovoltaic devices, such as photocells, are an important energy source that has thus far remained underutilized for widespread energy production. Photocells generate electrical energy by converting photons from a light source into electricity (e.g., by freeing electron-hole pairs). Conventional photocells, however, typically provide a light-to-electricity conversion efficiency of only up to about 25 percent. Such a low conversion efficiency makes conventional photocells an undesirable option for most applications.

Attempts have been made to increase photovoltaic device energy conversion efficiency using nanotechnology, by incorporating nanowires, nanocrystals, etc. into active layers of the device. See, for example, U.S. Patent Application No. 2005/0009224 filed by Yang et al., entitled "Nanowire Array and Nanowire Solar Cells and Methods for Forming the Same" (wherein nanowire oxides are used in conjunction with a charge transport medium in optoelectronic devices); U.S. Patent Application No. 2005/0214967 filed by Scher et al., entitled "Nanostructure and Nanocomposite Based Compositions and Photovoltaic Devices" (wherein nanostructures, such as core-shell nanocrystals, are used in photovoltaic devices oriented horizontally along an electrode plane) and Kayes et al., *Comparison of the Device Physics Principles of Planar and Radial p-n Junction Nanorod Solar Cells*, 97 J. APPL. PHYS. 114302 (2005) (wherein radial p-n junction nanorod solar cells are described).

Efficiency improvements are, however, still needed to make photovoltaics a viable and practical energy source.

SUMMARY OF THE INVENTION

The present invention provides photovoltaic devices and techniques for enhancing the light-to-electricity conversion efficiency thereof. In one aspect of the invention, a photovoltaic device is provided. The photovoltaic device comprises a photocell having a first photoactive layer and a second photoactive layer adjacent to the first photoactive layer so as to form a heterojunction between the first photoactive layer and the second photoactive layer; and a plurality of high-aspect-ratio nanostructures on one or more surfaces of the second photoactive layer. The plurality of high-aspect-ratio nanostructures are configured to act as a scattering media for incident light. The plurality of high-aspect-ratio nanostructures can also be configured to create an optical resonance effect in the incident light. The first photoactive layer can be doped with one of an n-type dopant or a p-type dopant and the second photoactive layer can be doped with the other of the n-type dopant or the p-type dopant such that a p-n junction is formed between the first photoactive layer and the second photoactive layer.

In another aspect of the invention, a method of fabricating a photovoltaic device is provided. The method comprises the following steps. A first photoactive layer is provided. A second photoactive layer is formed over the first photoactive layer so as to form a heterojunction between the first photoactive layer and the second photoactive layer. A plurality of high-aspect-ratio nanostructures are formed on one or more surfaces of the second photoactive layer. The plurality of high-aspect-ratio nanostructures are configured to act as a scattering media for incident light.

A more complete understanding of the present invention, as well as further features and advantages of the present invention, will be obtained by reference to the following detailed description and drawings.

DETAILED DESCRIPTION OF PREFERRED EMBODIMENTS

FIGS. 1A-D are cross-sectional diagrams illustrating an exemplary methodology for fabricating a photovoltaic device comprising a photocell having high-aspect-ratio nanostructures, i.e., nanowires, associated therewith. According to the present techniques, as will be described in detail below, the high-aspect-ratio nanostructures serve to enhance light absorption and thereby increase the light-to-electricity conversion efficiency of the present photovoltaic devices.

Figure 1A:
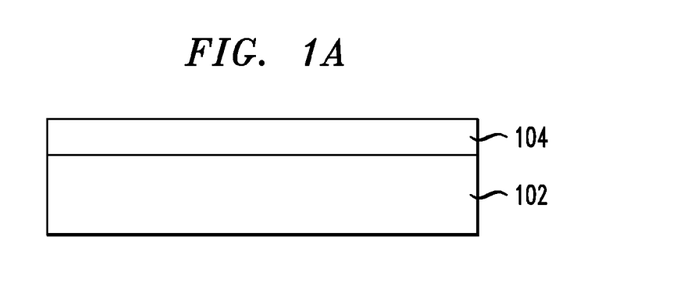
FIGS. 1A-D are cross-sectional diagrams illustrating an exemplary methodology for fabricating a photovoltaic device comprising a photocell having high-aspect-ratio nanostructures associated therewith according to an embodiment of the present invention.

As shown in FIG. 1A, a first photoactive layer 102 is provided. The term "photoactive layer," as used herein, refers to any device layer comprising a material that can absorb light energy and by way of that energy generate charge carriers (electron-hole pairs). Photoactive layer 102 can comprise a semiconductor material (such as one or more of silicon (Si), germanium (Ge), a group III-V element compound(s) and an organic material(s)) and/or a photoactive material with a chalcogenide crystal structure (such as a copper indium gallium selenide (CIGS) material(s)), and has a thickness of between about 20 micrometers (µm) and about 1,000 µm. According to an exemplary embodiment, photoactive layer 102 comprises a bulk Si (e.g., amorphous Si or polysilicon (poly-Si)) wafer that is doped with either an n-type or a p-type dopant. Suitable n-type dopants include, but are not limited to, phosphorous (P). Suitable p-type dopants include, but are not limited to, boron (B).

A second photoactive layer 104 is then formed, i.e., deposited or grown, over photoactive layer 102. Photoactive layer 104 acts as a charge collection layer of the device. Photoactive layer 104 can comprise a semiconductor material (such as one or more of Si, Ge, a group III-V element compound(s) and an organic material(s)), a photoactive material with a chalcogenide crystal structure (such as a CIGS material(s)), cadmium sulfide (CdS) and/or zinc oxide (ZnO). According to an exemplary embodiment, photoactive layer 104 comprises Si (amorphous Si or poly-Si) and is formed, i.e., grown, over photoactive layer 102 using a chemical vapor deposition (CVD) technique to a thickness of between about 20 angstroms (Å) (i.e., $2 \times 10^{-3}$ µm) and about 150 µm.

In general, each of the photovoltaic device configurations presented herein comprises a heterojunction formed between adjacent layers due to dissimilarities in material type (e.g., a Schottky junction, see description below) and/or doping type (e.g., a p-n junction). For example, photoactive layer 104 can be formed having an opposite polarity from photoactive layer 102, so as to form a p-n junction. Namely, if photoactive layer 102 comprises an n-type semiconductor, then photoactive layer 104 can be formed from a p-type semiconductor so as to form a p-n junction between photoactive layers 102 and 104. Conversely, if photoactive layer 102 comprises a p-type semiconductor, then photoactive layer 104 can be formed from an n-type semiconductor so as to form a p-n junction between photoactive layers 102 and 104. By way of example only, an n-type or p-type dopant(s) can be introduced during CVD growth of photoactive layer 104 by way of dopant precursors such as phosphine ($PH_3$) (an n-type dopant precursor) or diborane ($B_2H_6$) (a p-type dopant precursor). Alternatively, high temperature diffusion from a dopant source can be used to introduce an n-type or p-type dopant(s) into photoactive layer 104. As such, a photocell is formed having a p-n junction, i.e., between photoactive layer 102 and photoactive layer 104, serving to separate photogenerated charge carriers (electron-hole pairs) in each of photoactive layer 102 and photoactive layer 104.

Figure 2:
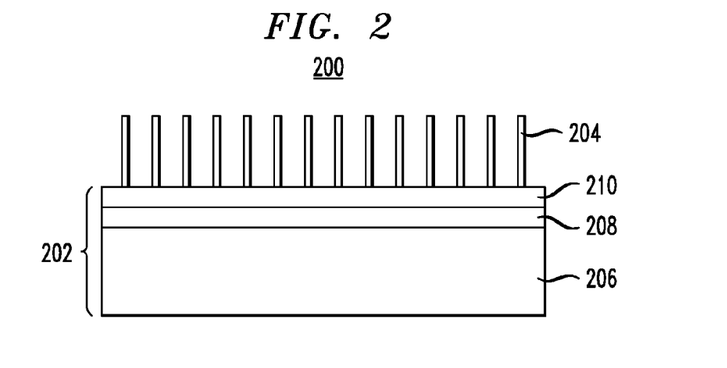
FIG. 2 is a diagram illustrating an exemplary photovoltaic device comprising a thin-film semiconductor photocell with high-aspect-ratio nanostructures associated therewith according to an embodiment of the present invention.
Figure 3:
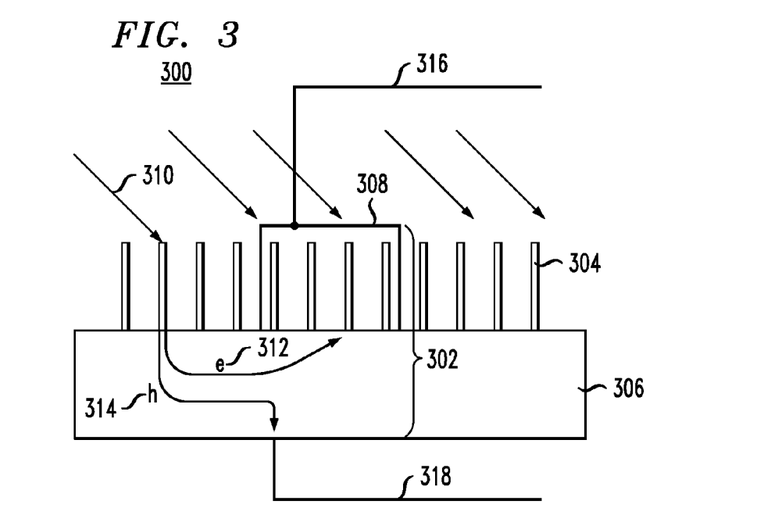
FIG. 3 is a diagram illustrating an exemplary photovoltaic device having a Schottky junction-based photocell with high-aspect-ratio nanostructures associated therewith according to an embodiment of the present invention.
Figure 4:
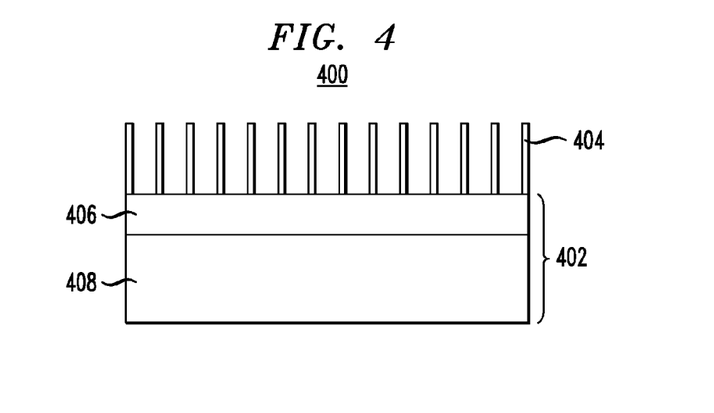
FIG. 4 is a diagram illustrating an exemplary photovoltaic device comprising a photocell formed from a combination of photoactive and non-photoactive layers, with high-aspect-ratio nanostructures associated therewith according to an embodiment of the present invention.

The photocell configuration shown in FIG. 1A is merely exemplary, and any other suitable photocell configuration can be employed in accordance with the present teachings. Namely, any photocell configuration wherein an arrangement of junctions allows the generated electron-hole pairs to be separated to provide a useful current can be employed. For example, the photocell can comprise a thin-film semiconductor photocell. An exemplary thin-film semiconductor photocell is shown in FIG. 2 (described below). The photocell may also comprise a Schottky junction. An exemplary Schottky junction-based photocell is shown in FIG. 3 (described below). The photocell may further comprise a p-n junction formed from a combination of photoactive and non-photoactive layers. An exemplary photocell having photoactive and non-photoactive layers is shown in FIG. 4 (described below).

High-aspect-ratio nanostructures, such as nanowires, microcolumns and/or nanotubes, are then formed on one more surfaces of the photocell. The term "high-aspect-ratio nanostructures," as used herein, refers generally to any rod-like structures having a diameter of between about five nanometers (nm) and about 200 nm, and a length of between about 0.1 µm and about 100 µm, e.g., between about three µm and about 30 µm.

The high-aspect-ratio nanostructures enhance light absorption by the photocell, and thereby increase the light-to-electricity conversion efficiency of the photovoltaic device. Namely, high-aspect-ratio nanostructures having the above dimensions can be employed with a spacing between adjacent nanostructures of between about 100 nm and about three µm. This spacing of between about 100 nm and about three µm is comparable to, or a few times, the wavelength(s) of visible incident light, which is typically between about 0.4 µm and about one µm. As such, the high-aspect-ratio nanostructures can act as a good scattering media for the incident light. The incident light thus becomes localized on those surfaces of the photocell having the high-aspect-ratio nanostructures, thereby enhancing light absorption by the photocell.

The high-aspect-ratio nanostructures can also enhance light absorption by acting as "antennae" for incident light. Namely, the high-aspect-ratio nanostructures can create an optical resonance effect in the incident light that provides a more effective coupling between electromagnetic fields of the incident light and the high-aspect-ratio nanostructures. As such, the high-aspect-ratio nanostructures are formed primarily on the light-absorbing surfaces of the photocell.

Figure 1B:
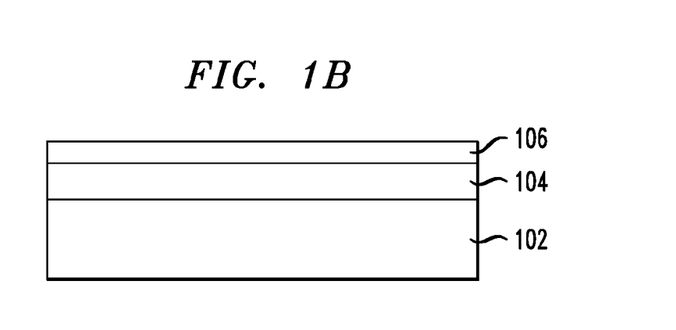
Figure 1C:
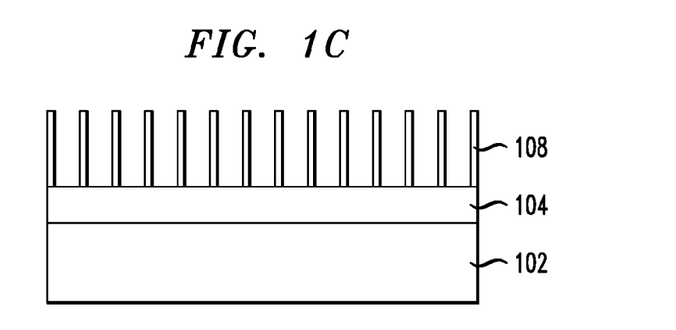

FIGS. 1B-C illustrate the formation of Si nanowires on a top, light-absorbing surface of the photocell, i.e., on photoactive layer 104. These techniques as well as any other techniques suitable for forming high-aspect-ratio nanostructures on any of the photocell configurations described above, such as etching, may be used in accordance with the present teachings. For a description of microcolumns and techniques for the formation thereof, see for example, Guha et al. "Selective area metalorganic molecular-beam epitaxy of GaN and the growth of luminescent microcolumns on $Si/SiO_2$," Appl. Phys. Lett. 75, 463 (2007), the contents of which is incorporated by reference herein.

As shown in FIG. 1B, a catalyst layer 106 is deposited over a side of photoactive layer 104 opposite photoactive layer 102. According to an exemplary embodiment, catalyst layer 106 comprises gold (Au) and is deposited over photoactive layer 104 by evaporation to a thickness of about 30 Å. Following deposition of the catalyst layer, the photocell is inserted into a CVD system and, as shown in FIG. 1C, Si nanowires are grown, e.g., by a vapor-liquid-solid (VLS)-CVD technique. For a detailed description of nanowire formation, see, for example, U.S. application Ser. No. 11/494,195, entitled "Techniques for Use of Nanotechnology in Photovoltaics," designated as Attorney Reference Number YOR920060365US1, filed on Jul. 27, 2006, the contents of which is incorporated by reference herein. While the formation of Si nanowires is described, it is to be understood that the high-aspect-ratio nanostructures may comprise any material that can act as a scatterer and/or an absorber of light, such as one or more of a semiconductor material (e.g., Si, Ge or silicon-germanium (SiGe)), a dielectric material and a metal.

Optionally, an n-type and/or a p-type doping agent may be introduced during nanowire growth, resulting in n-type and/or p-type doped nanowires. Suitable doping agents include, but are not limited to, $B_2H_6$ and $PH_3$. By way of example only, if the photocell is exposed to an ambient of silane ($SiH_4$) and $B_2H_6$, boron-doped (B-doped), p-type Si nanowire growth will result. Similarly, if the photocell is exposed to an ambient of $SiH_4$ and $PH_3$, phosphorous-doped (P-doped), n-type Si nanowire growth will result.

Additionally, a shell layer can be formed around one or more of the nanowires. When this configuration is employed, it is preferable that the shell layer have a different polarity and/or different dopant concentration from the nanowire(s). The formation of a shell layer is described in detail, for example, in conjunction with the description of FIG. 5, below.

As shown in FIG. 1C, a plurality of nanowires 108, referred to herein collectively as a "nanowire forest," are formed on a top surface of photoactive layer 104. The configuration of nanowires 108 shown in FIG. 1C is representative of a non-random placement pattern, wherein the nanowires are evenly spaced from one another and aligned in a specific direction (in this case perpendicular to photoactive layer 104). Alternatively, a random placement pattern (not shown), wherein the nanowires are variably spaced from one another and project from the surface of photoactive layer 104 at a variety of different angles can also be employed.

A non-random placement pattern (also called a "regular arrangement") can be obtained by patterning the catalyst layer (see FIG. 1B), e.g., using electron-beam lithography, to form an array of islands prior to the VLS-CVD growth. A random placement pattern can be obtained by annealing the catalyst layer at a temperature of about 500 degrees Celsius (° C.) prior to the VLS-CVD growth.

Due to the presence of the high-aspect-ratio nanostructures, an increased amount of incident light is absorbed by photoactive layers 102 and 104 as compared to similar devices without the high-aspect-ratio nanostructures. See, for example, FIG. 9 (described below). This enhanced efficiency permits thinner photoactive layers to be used in the present photocells. Reducing the thicknesses of the photoactive layers can improve absorption of shorter wavelengths of light.

Figure 1D:
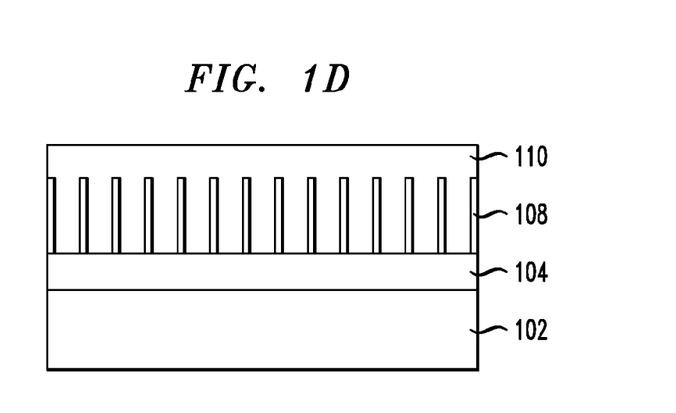

As shown in FIG. 1D, a transparent electrode 110 is formed over, i.e., covering, the nanowire forest. According to an exemplary embodiment, transparent electrode 110 comprises indium-tin-oxide (ITO) and is deposited over the nanowire forest using a sputter deposition technique. Transparent electrode 110 serves as an electrical contact to the photocell. Other electrical contact configurations are, however, possible. By way of example only, instead of using an electrode over the entire nanowire forest, one or more smaller electrodes may be formed on the photoactive layer so as to be surrounded by the nanowire forest. This configuration is shown, for example, in FIG. 6 (described below).

FIG. 2 is a diagram illustrating exemplary photovoltaic device 200 comprising thin-film semiconductor photocell 202 with high-aspect-ratio nanostructures, i.e., nanowires 204, associated therewith. Namely, thin-film semiconductor photocell 202 comprises arbitrary substrate 206, first photoactive layer 208 adjacent to substrate 206 and second photoactive layer 210 adjacent to a side of photoactive layer 208 opposite substrate 206. According to an exemplary embodiment, substrate 206 comprises a glass, a metal and/or a plastic substrate, photoactive layer 208 comprises a semiconductor material (such as one or more of Si, Ge, a group III-V element compound(s) and an organic material(s)) and/or a photoactive material with a chalcogenide crystal structure (such as a CIGS material(s)) and photoactive layer 210 comprises a semiconductor material (such as one or more of Si, Ge, a group III-V element compound(s) and an organic material (s)), a photoactive material with a chalcogenide crystal structure (such as a CIGS material(s)), CdS and/or ZnO. Each of photoactive layers 208 and 210 can have a thickness of between about one nm and about 100 nm. Nanowires 204 collectively form a nanowire forest over photoactive layer 210.

FIG. 3 is a diagram illustrating exemplary photovoltaic device 300 comprising Schottky junction-based photocell 302 with high-aspect-ratio nanostructures, i.e., nanowires 304, associated therewith. Namely, photocell 302 comprises photoactive layer 306 and metal layer 308 adjacent to, i.e., over at least a portion of, photoactive layer 306 so as to form a Schottky junction between photoactive layer 306 and metal layer 308. Nanowires 304 collectively form a nanowire forest over photoactive layer 306. Metal layer 308 can be deposited over photoactive layer 306 so as to cover some of the nanowires. Photoactive layer 306 can comprise a semiconductor material (such as one or more of Si, Ge, a group III-V element compound(s) and an organic material(s)) and/or a photoactive material with a chalcogenide crystal structure (such as a CIGS material(s)). According to an exemplary embodiment, photoactive layer 306 comprises an n-type semiconductor (e.g., Si doped with an n-type dopant) and metal layer 308 comprises one or more of nickel (Ni), palladium (Pd) and Au and is deposited over photoactive layer 306 using an evaporation technique to a thickness of between about 10 nm and about 150 nm.

During operation, nanowires 304 aid in capturing and absorbing incident light (arrows 310) and generating charge carriers (electron-hole pairs), i.e., electrons 312 and holes 314, which can be transported to electrical leads 316 and 318, respectively. It is further notable that the nanowires under the metal layer can also serve to capture and absorb the incident light if the metal layer surrounding these nanowires is thin enough to pass the light.

FIG. 4 is a diagram illustrating exemplary photovoltaic device 400 comprising photocell 402 with high-aspect-ratio nanostructures, i.e., nanowires 404, associated therewith. Photocell 402 is formed from a combination of photoactive and non-photoactive layers. Namely, photoactive layer 406 is present adjacent to non-photoactive layer 408. According to an exemplary embodiment, photoactive layer 406 has an opposite polarity from non-photoactive layer 408. Namely, if photoactive layer 406 is doped with an n-type dopant, then non-photoactive layer 408 is doped with a p-type dopant. Similarly, if photoactive layer 406 is doped with a p-type dopant, then non-photoactive layer 408 is doped with an n-type dopant. As a result, a p-n junction is formed between photoactive layer 406 and non-photoactive layer 408. Nanowires 404 collectively form a nanowire forest over photoactive layer 406 and serve to scatter incident light. The incident light is absorbed both by nanowires 404 and by photoactive layer 406. As a result, electron-hole pairs are generated and the charge carriers transported to the p-n junction.

Alternatively, non-photoactive layer 408 can comprise a metal layer, thus forming a Schottky junction with photoactive layer 406. See also, FIG. 5 (described below).

Figure 5:
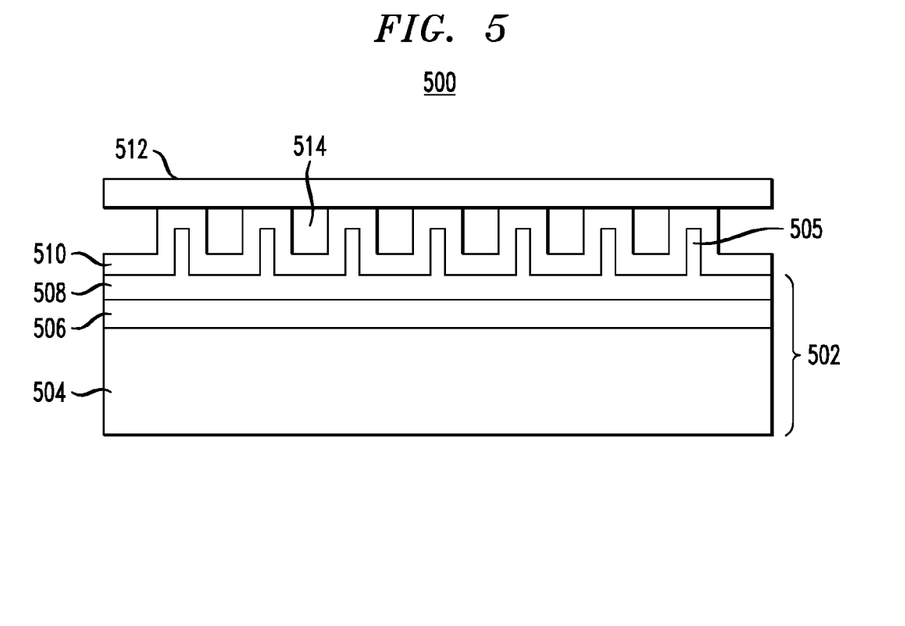
FIG. 5 is a diagram illustrating an exemplary photovoltaic device comprising a photocell with core/shell high-aspect-ratio nanostructures associated therewith according to an embodiment of the present invention.

FIG. 5 is a diagram illustrating exemplary photovoltaic device 500 comprising photocell 502 with high-aspect-ratio nanostructures, i.e., nanowires 505, associated therewith. Namely, photovoltaic device 500 comprises substrate 504, metal layer 506 adjacent to substrate 504 and photoactive layer 508 adjacent to a side of metal layer 506 opposite substrate 504. According to an exemplary embodiment, substrate 504 comprises a glass, a metal and/or a plastic substrate. Metal layer 506 forms a Schottky junction with photoactive layer 508.

Photoactive layer 508, e.g., a conformal layer of semiconductor, is formed during the nanowire growth process and can have a thickness of between about one nm and about 100 nm. Thus, nanowires 505 are continuous with photoactive layer 508. A shell layer 510 is present over nanowires 505/photoactive layer 508. It is preferable that shell layer 510 has a different polarity and/or different dopant concentration from nanowires 505. For example, a p-type doped shell layer would be used in combination with n-type doped nanowires, and vice-a-versa. According to this configuration, a high-aspect-ratio nanostructure around which a shell layer is formed is referred to as a "nanostructure core."

The shell layer can be formed in a manner similar to the high-aspect-ratio nanostructures. Namely, once the nanostructure cores are formed, a conformal layer is grown that wraps around each core. This conformal "shell" layer is grown with the addition of a dopant of different polarity and/or concentration from the core. In this fashion, the shell layer created is different from the core. As will be described, for example, in conjunction with the description of FIG. 7, below, employing a nanostructure core/shell configuration, as described herein, can further enhance the light absorption of a photocell, as compared to the use of high-aspect-ratio nanostructures alone.

Transparent electrode 512 is present over the nanowires/shell layer. According to an exemplary embodiment, transparent electrode 512 comprises ITO and/or doped ZnO. Filler material 514 may be present in spaces between the transparent electrode and the nanowires/shell layer.

During operation of photovoltaic device 500, the nanowires/shell layer serve to scatter incident light. The incident light is absorbed by both the nanowires/shell layer and photoactive layer 508. As a result, electron-hole pairs are generated and charge carriers are transported to the Schottky junction.

Figure 6:
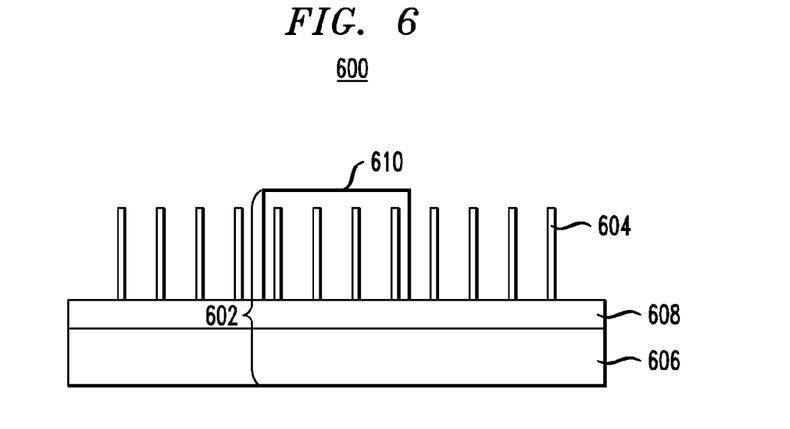
FIG. 6 is a diagram illustrating an exemplary photovoltaic device comprising a photocell having a transparent electrode surrounded by a nanowire forest according to an embodiment of the present invention.

FIG. 6 is a diagram illustrating exemplary photovoltaic device 600 comprising photocell 602 with high-aspect-ratio nanostructures, i.e., nanowires 604, associated therewith. Namely, photocell 602 comprises first photoactive layer 606 and second photoactive layer 608 adjacent to photoactive layer 606. According to an exemplary embodiment, photoactive layer 606 comprises a semiconductor material (such as one or more of Si, Ge, a group III-V element compound(s) and an organic material(s)) and/or a photoactive material with a chalcogenide crystal structure (such as a CIGS material(s)) and photoactive layer 608 comprises a semiconductor material (such as one or more of Si, Ge, a group III-V element compound(s) and an organic material(s)), a photoactive material with a chalcogenide crystal structure (such as a CIGS material(s)), CdS and/or ZnO. Nanowires 604 collectively form a nanowire forest over photoactive layer 608. Electrode 610 is present on photoactive layer 608 so as to be surrounded by the nanowire forest. Namely, as compared to electrode 110 described, for example, in conjunction with the description of FIG. 1D, above, electrode 610 covers only some of the nanowires, leaving the remainder of the nanowire forest to surround the electrode 610. According to one embodiment, electrode 610 comprises ITO and is transparent. Multiple electrodes 610 may be present on photoactive layer 608 and surrounded by the nanowire forest.

Figure 7:
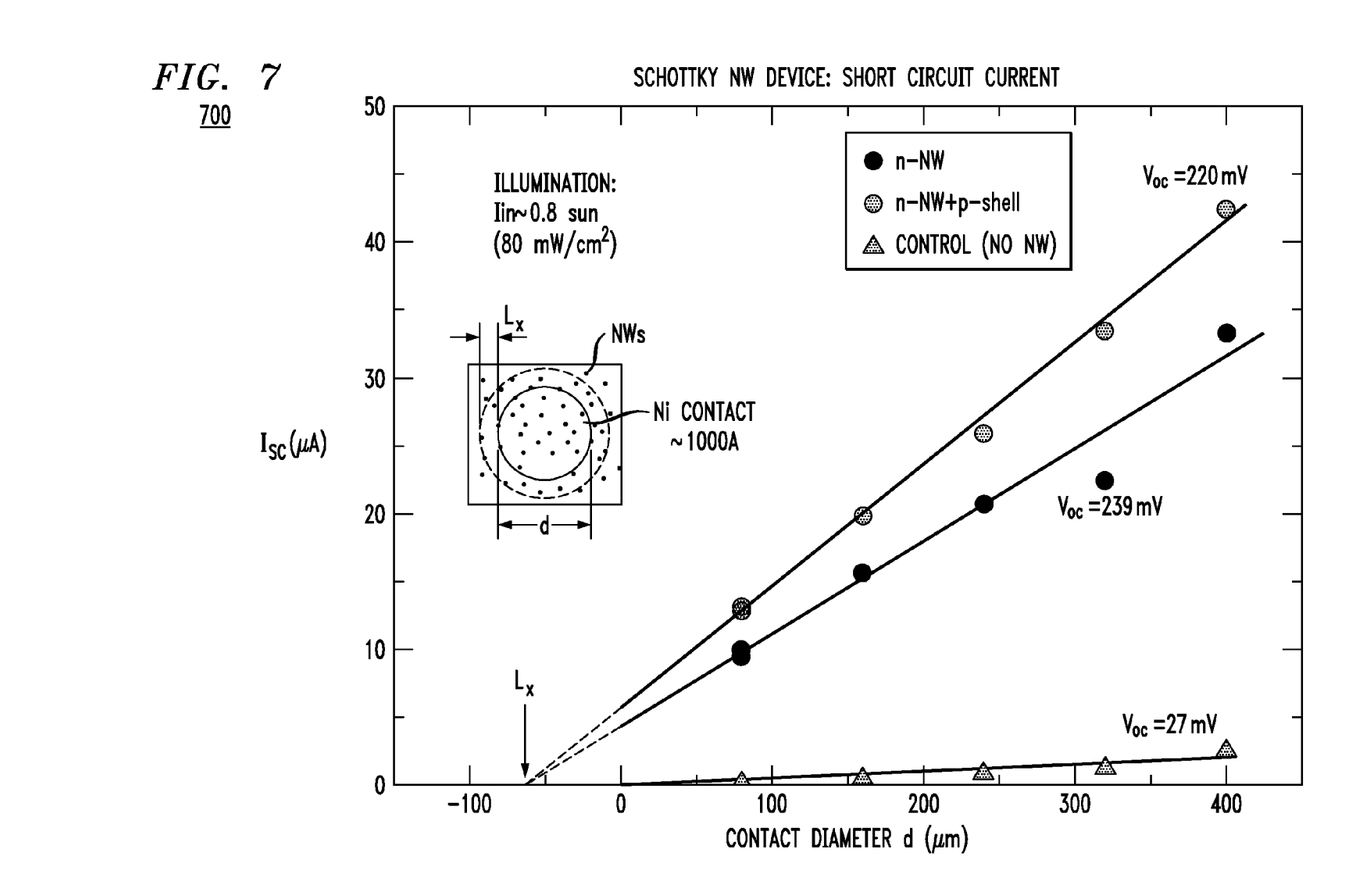
FIG. 7 is a graph illustrating enhanced performance of a Schottky junction-based photocell with high-aspect-ratio nanostructures having an n-type doped core and a p-type doped shell layer according to an embodiment of the present invention.

FIG. 7 is a graph 700 illustrating enhanced performance of a Schottky junction-based photocell with high-aspect-ratio nanostructures, i.e., nanowires, having an n-doped core and a p-doped shell. Namely, graph 700 illustrates contact diameter d (measured in μm) versus short circuit photocurrent $I_{SC}$ (measured in microamps (μA)) for a Schottky junction-based photocell with n-doped nanowires (labeled "n-NW"), a Schottky junction-based photocell with nanowires having an n-doped core and a p-doped shell (labeled "n-NW+p-shell") and a Schottky junction-based photocell without nanowires (labeled "control (no NW)"). Illumination $I_{in}$ was 80 milliwatts per square centimeter (mW/cm$^2$) (i.e., about 0.8 suns). As such, the data presented in graph 700 clearly demonstrates the enhancement of the photocurrent due to the presence of the nanowires, and especially to the presence of nanowires having an n-doped core and a p-doped shell.

Example

The present techniques are further described by way of reference to the following non-limiting example:

A Schottky junction-based nanowire photocell: an n-doped Si substrate was coated with a three millimeter (mm) thick layer of Au by thermal evaporation of Au. The wafer was then inserted into a CVD chamber and heated to 550° C. under 200 standard cubic centimeters per minute (sccm) of hydrogen (H$_2$) gas flow. As a result, the Au forms small islands on the surface of the Si substrate which allows for the preferential nucleation of Si nanowires when a 50 sccm SiH$_4$ gas flow is initiated into the CVD chamber in the presence of 50 sccm of PH$_3$ serving as a doping precursor (i.e., that later will be transformed to be the dopant during the nanowire growth). Nanowires were then grown by VLS-CVD. After nanowire growth, any remnants of the Au were removed using an iodine-based etchant type TFA (manufactured by the Transene Company, Danvers, Mass.). A native silicon dioxide (SiO$_2$) layer (an unwanted by-product of the growth process which typically forms by natural oxidation on exposure to ambient air) was then removed by buffered oxide etching (BOE). Circular contacts with diameters d of between about 50 μm and about 400 μm were then fabricated on the nanowire-covered substrate by depositing a 130 nm thick layer of Ni by evaporation. A scanning electron micrograph (SEM) image of the resulting structure is shown in FIG. 8.

Figure 8:
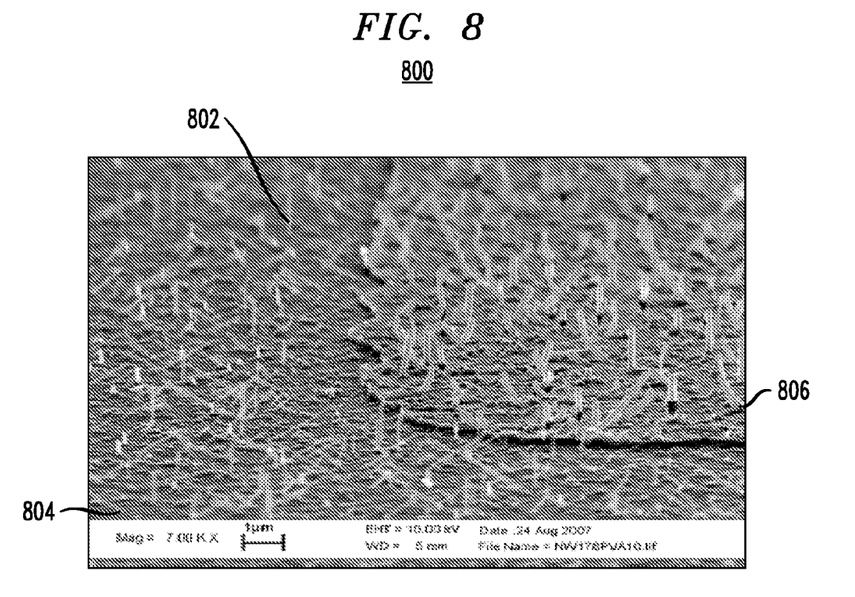
FIG. 8 is a scanning electron micrograph (SEM) image of a Schottky junction-based photocell having high-aspect-ratio nanostructures associated therewith according to an embodiment of the present invention.

FIG. 8 is SEM image 800 of a Schottky junction-based photocell having high-aspect-ratio nanostructures, i.e., nanowires 802, associated therewith. As can be seen from image 800, nanowires 802 are present on the surfaces of substrate 804 and covered by Ni contact 806 (visible in the right half of the image).

A control sample (i.e., a Schottky junction-based photocell) was also used which was inserted into the CVD chamber along with the nanowire sample, except that the control sample did not contain the Au nucleation layer. As a result no nanowires grew on the control sample. Ni contacts were deposited on the control sample in exactly the same fashion. An image of the control sample is shown in FIG. 9.

Figure 9:
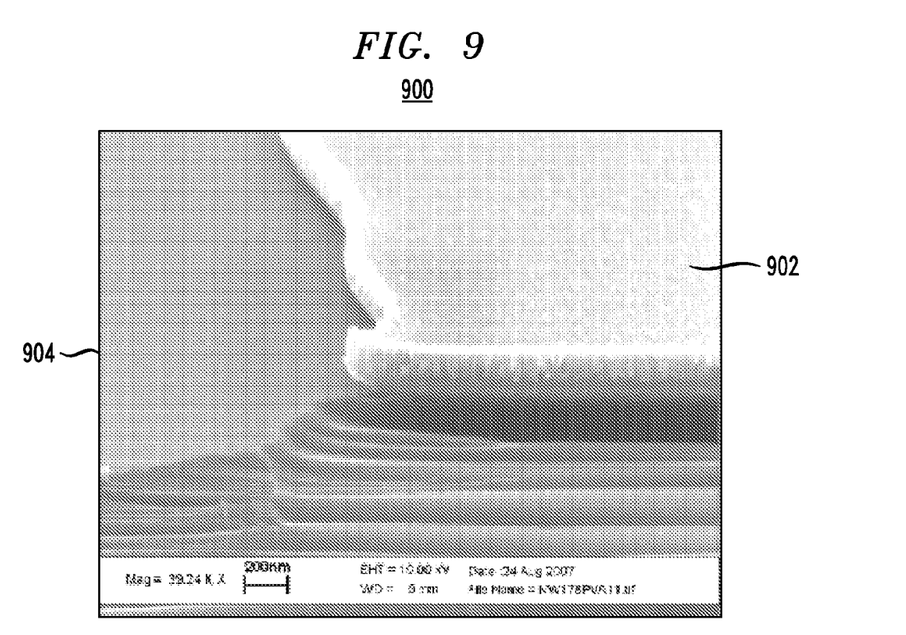
FIG. 9 is an SEM image of a Schottky junction-based photocell without high-aspect-ratio nanostructures according to an embodiment of the present invention.

FIG. 9 is SEM image 900 of a Schottky junction-based photocell. The Schottky junction-based photocell comprises Ni contact 902 over n-doped Si substrate 904. As can be seen from image 900, since the Au nucleation layer was not present, no nanowires grew in this control sample.

Both of the Schottky junction-based photocells described in conjunction with the description of FIGS. 8 and 9, above, i.e., one with nanowires and one without nanowires, respectively, were measured for photovoltaic performance, and a clear enhancement in photocurrent was observed for the photocell that had the nanowires associated therewith. The photocurrent observed was a combination of current measured due to electron-hole generation underneath the electrode, as well as the electron-hole generation in the area surrounding the Ni contact and within a capture cross-section (i.e., an area where photo-generated carriers can be effectively collected). A dimension of this capture cross-section will typically be of the order of a minority carrier diffusion length (i.e., an average length minority carriers travel before they are lost to recombination).

Figure 10:
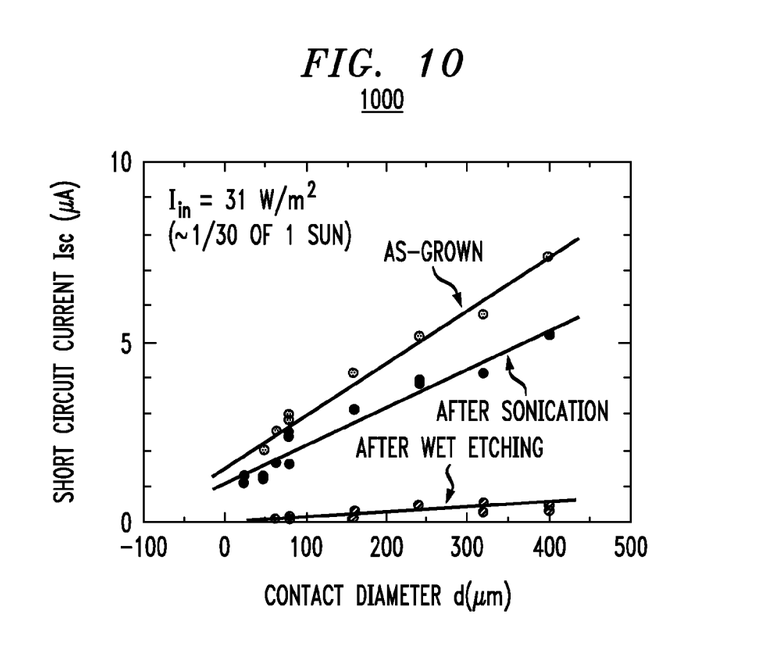
FIG. 10 is a graph illustrating contact diameter versus short circuit photocurrent for several different Schottky junction-based photocell configurations according to an embodiment of the present invention.

FIG. 10 is a graph 1000 illustrating contact diameter d (measured in μm) versus short circuit photocurrent $I_{SC}$ (measured in μA) for several different Schottky junction-based photocell configurations. Namely, as shown in graph 1000, a comparison was made of the $I_{SC}$ for the following cases, all being variations of the Schottky junction-based photocell of FIG. 8. In the first case, the $I_{SC}$ was measured in the Schottky junction-based photocell of FIG. 8 having nanowires associated therewith (described above) (labeled "as-grown"). In the second case, sonication was used to remove some of the nanowires from the photocell (labeled "after sonication") and the Schottky junction-based photocell, now with a portion of the nanowires removed, was again measured. Note the significant drop in the $I_{SC}$ which demonstrates the contribution of the nanowires to the photocurrent. In the third case, the n-doped Si substrate was etched down using tetramethylammonium hydroxide (TMAH) at 85° C. for five minutes to remove all remaining nanowires from the photocell (labeled "after wet etching"). The Schottky junction-based photocell, now subject to the etching, was again measured and the results show a further depression of the $I_{SC}$. $I_{in}$ was 30 Watts per square meter (W/m²) (i.e., about 1/30 of one sun). As such, the data presented in graph 1000 clearly demonstrates the enhancement of the photocurrent due to the presence of the nanowires.

Figure 11:
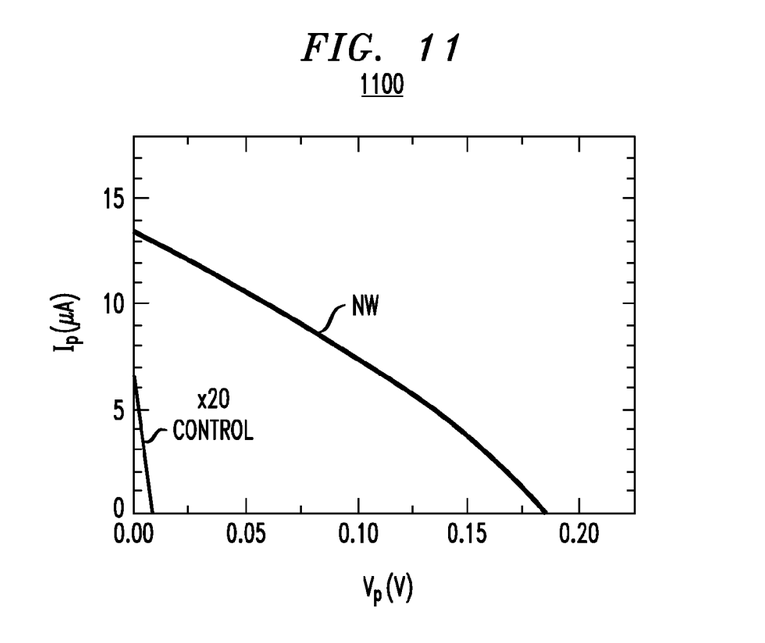
FIG. 11 is a graph illustrating applied voltage to photocell versus photocell current for Schottky junction-based photocells both with and without high-aspect-ratio nanostructures according to an embodiment of the present invention.

FIG. 11 is a graph 1100 illustrating applied voltage to photocell $V_P$, (measured in volts (V)) versus photocell current $I_P$ (measured in μA) for two different Schottky junction-based photocell configurations under an $I_{in}$ of about 30 W/m². Namely, FIG. 11 shows a comparison of the photocurrent for the Schottky junction-based photocell sample of FIG. 8 having nanowires associated therewith (labeled "NW") and for the Schottky junction-based photocell control sample of FIG. 9 without nanowires (labeled "control") (both described above). Again, a vast difference in photocurrent between the two samples is observed.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A photovoltaic device comprising:
 a photocell having a first photoactive layer, a second photoactive layer on, and in contact with, the first photoactive layer so as to form a heterojunction between the first photoactive layer and the second photoactive layer, and a transparent electrode on, and in direct contact with, a side of the second photoactive layer opposite the first photoactive layer; and
 a plurality of either n-type doped or p-type doped high-aspect-ratio nanostructures formed on, and in direct contact with, the side of the second photoactive layer opposite the first photoactive layer, wherein the plurality of high-aspect-ratio nanostructures have a spacing between adjacent nanostructures of between about 100 nanometers and about three micrometers thus being configured to act as a scattering media for incident light, wherein each of the plurality of high-aspect-ratio nanostructures has a length of between about 0.1 micrometers and about 100 micrometers, and
 wherein the transparent electrode on the second photoactive layer covers only some of the plurality of high-aspect-ratio nanostructures leaving a remainder of the plurality of high-aspect-ratio nanostructures uncovered and surrounding the transparent electrode.

2. The device of claim 1, wherein the plurality of high-aspect-ratio nanostructures are further configured to create an optical resonance effect in the incident light.

3. The device of claim 1, wherein the first photoactive layer is doped with one of an n-type dopant or a p-type dopant and the second photoactive layer is doped with the other of the n-type dopant or the p-type dopant such that a p-n junction is formed between the first photoactive layer and the second photoactive layer.

4. The device of claim 1, wherein the first photoactive layer comprises one or more of silicon, germanium, a group III-V element compound and an organic material.

5. The device of claim 1, wherein the first photoactive layer comprises a photoactive material with a chalcogenide crystal structure.

6. The device of claim 5, wherein the first photoactive layer comprises a copper indium gallium selenide material.

7. The device of claim 1, wherein the second photoactive layer comprises one or more of a semiconductor material, silicon, germanium, a group III-V element compound, an organic material, a photoactive material with a chalcogenide crystal structure, a copper indium gallium selenide material, cadmium sulfide and zinc oxide.

8. The device of claim 1, wherein the first photoactive layer has a thickness of between about 20 micrometers and about 1,000 micrometers, and the second photoactive layer has a thickness of between about $2 \times 10^{-3}$ micrometers and about 150 micrometers.

9. The device of claim 1, further comprising a substrate adjacent to a side of the first photoactive layer opposite the second photoactive layer, and wherein each of the first photoactive layer and the second photoactive layer comprises a thin film on the substrate having a thickness of between about one nanometer and about 100 nanometers.

10. The device of claim 1, wherein each high-aspect-ratio nanostructure has a diameter of between about five nanometers and about 200 nanometers.

11. The device of claim 1, wherein each high-aspect-ratio nanostructure has a length of between about three micrometers and about 30 micrometers.

12. The device of claim 1, wherein the plurality of high-aspect-ratio nanostructures comprises one or more of nanowires, microcolumns and nanotubes.

13. The device of claim 1, wherein the plurality of high-aspect-ratio nanostructures comprises a nanowire forest.

14. The device of claim 1, further comprising a shell layer covering the plurality of high-aspect-ratio nanostructures.

15. The device of claim 14, wherein the shell layer is doped and has a different dopant concentration from the plurality of high-aspect-ratio nanostructures.

16. The device of claim 1, wherein each high-aspect-ratio nanostructure comprises one or more of a semiconductor material, a dielectric material and a metal.

17. The device of claim 16, wherein the semiconductor material comprises one or more of silicon, germanium and silicon-germanium.

18. A method of fabricating a photovoltaic device, comprising the steps of:
providing a first photoactive layer;
forming a second photoactive layer on, and in contact with, the first photoactive layer so as to form a heterojunction between the first photoactive layer and the second photoactive layer;
forming a transparent electrode on, and in direct contact with, a side of the second photoactive layer opposite the first photoactive layer; and
forming a plurality of either n-type doped or p-type doped high-aspect-ratio nanostructures on, and in direct contact with, the side of the second photoactive layer opposite the first photoactive layer, wherein the plurality of high-aspect-ratio nanostructures have a spacing between adjacent nanostructures of between about 100 nanometers and about three micrometers thus being configured to act as a scattering media for incident light,
wherein each of the plurality of high-aspect-ratio nanostructures has a length of between about 0.1 micrometers and about 100 micrometers, and
wherein the transparent electrode is formed on the second photoactive layer so as to cover only some of the plurality of high-aspect-ratio nanostructures leaving a remainder of the plurality of high-aspect-ratio nanostructures uncovered and surrounding the transparent electrode.

19. The method of claim 18, further comprising the step of:
growing the second photoactive layer on the first photoactive layer using a chemical vapor deposition technique.

20. The method of claim 18, wherein the step of forming a plurality of high-aspect-ratio nanostructures further comprises the steps of:
depositing a catalyst layer over the second photoactive layer;
patterning the catalyst layer using e-beam lithography to form an array of islands; and
growing the plurality of high-aspect-ratio nanostructures on the second photoactive layer by a vapor-liquid-solid-chemical vapor deposition technique, wherein the step of patterning the catalyst layer is performed prior to the step of growing the plurality of high-aspect-ratio nanostructures so as to produce a regular arrangement of the plurality of high-aspect-ratio nanostructures on the second photoactive layer.

* * * * *